US010937748B1

(12) United States Patent
Kanj et al.

(10) Patent No.: US 10,937,748 B1
(45) Date of Patent: Mar. 2, 2021

(54) FAN-OUT TRANSITION STRUCTURE FOR TRANSMISSION OF MM-WAVE SIGNALS FROM IC TO PCB VIA CHIP-SCALE PACKAGING

(71) Applicant: HUAWEI TECHNOLOGIES CO., LTD., Guangdong (CN)

(72) Inventors: Houssam Kanj, Waterloo (CA); Wenyao Zhai, Kanata (CA); Hari Krishna Pothula, Kanata (CN); Morris Repeta, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/568,715

(22) Filed: Sep. 12, 2019

(51) Int. Cl.
| | |
|---|---|
| H03H 7/38 | (2006.01) |
| H01L 23/66 | (2006.01) |
| H05K 1/02 | (2006.01) |
| H01P 5/22 | (2006.01) |
| H01P 3/20 | (2006.01) |

(Continued)

(52) U.S. Cl.
CPC .............. *H01L 23/66* (2013.01); *H01L 24/09* (2013.01); *H01P 3/081* (2013.01); *H01P 3/20* (2013.01); *H01P 5/22* (2013.01); *H03H 7/38* (2013.01); *H05K 1/0246* (2013.01); *H01L 2223/6616* (2013.01); *H01L 2223/6633* (2013.01); *H01L 2223/6677* (2013.01); *H01L 2224/02379* (2013.01); *H01L 2924/15311* (2013.01)

(58) Field of Classification Search
CPC ........... H03H 7/38; H01L 23/66; H01L 23/64; H01L 2223/6616; H01L 2223/6633; H01L 2224/02379; H01L 2924/3011; H01P 5/08

USPC .................. 333/33, 238, 246, 247, 254, 260
See application file for complete search history.

(56) References Cited

U.S. PATENT DOCUMENTS

| | | | | |
|---|---|---|---|---|
| 8,410,874 B2 * | 4/2013 | Song | ...................... | H01P 5/028 333/247 |
| 2015/0035615 A1 * | 2/2015 | Boone | ..................... | H01P 5/085 333/33 |

FOREIGN PATENT DOCUMENTS

| | | |
|---|---|---|
| CN | 104916892 A | 9/2015 |
| CN | 108231750 A | 6/2018 |

(Continued)

OTHER PUBLICATIONS

International Search Report and Written Opinion of PCT/CN2020/115033; Miao LV; dated Dec. 11, 2020.

*Primary Examiner* — Stephen E. Jones
(74) *Attorney, Agent, or Firm* — BCF LLP (57) ABSTRACT

The disclosed systems, structures, and methods are directed to a mm-Wave communication structure employing a first transmission structure employing a first ring transition structure followed by a first ground structure and a second ground structure configured to carry a ground signal, a second transmission structure employing a second ring transition structure followed by a third ground structure and a fourth ground structure configured to carry the ground signal, a third transmission structure configured to carry a mm-Wave signal, wherein the third transmission structure begins at the center of the first ring transition structure and the second ring transition structure and the third transmission structure is coplanar with the second transmission structure, and a fourth transmission structure configured to operatively couple an IC and the first transmission layer, the second transmission layer, and the third transmission structure.

23 Claims, 11 Drawing Sheets

(51) Int. Cl.
*H01P 3/08* (2006.01)
*H01L 23/00* (2006.01)

(56) References Cited

FOREIGN PATENT DOCUMENTS

| | | |
|---|---|---|
| CN | 109166845 A | 1/2019 |
| EP | 3364457 A1 | 8/2018 |

* cited by examiner

FAN-OUT TRANSITION STRUCTURE FOR TRANSMISSION OF MM-WAVE SIGNALS FROM IC TO PCB VIA CHIP-SCALE PACKAGING

CROSS-REFERENCE TO RELATED APPLICATIONS

This is the first application filed for the instantly disclosed technology.

FIELD OF THE INVENTION

The present invention generally relates to the field of mm-Wave communications and, in particular, to integrated circuits (ICs) and corresponding packaging technologies that incorporate efficient transition structures to provide impedance matching and minimization of mutual energy coupling to achieve efficient fan-out transmissions of mm-Wave signals.

BACKGROUND

Radio-frequency (RF) communication systems often employ packaging technologies that incorporate various RF radiation-related components onto planar, board-type structures. These packaging structures are configured to achieve the required RF propagation properties while providing certain installation and fabrication advantages, such as, simpler designs, ease of operational testing/verification, reduced masking steps, minimal production time-to-market, etc.

However, RF communication systems operating at mm-Wave frequencies (primarily at E-B and), have been identified as being potentially disruptive to the implementation of trending wireless technologies, such as, for example, fifth generation (5G) networks. In particular, the existing E-Band 10 GHz spectrum operating at, 71-76 GHz and 81-86 GHz presents certain conflicting issues regarding 5G high data rate applications.

Thus, to achieve high data rates with mm-Wave technologies and avoid potential 5G conflict issues, RF communication systems require antenna arrays to have directional steering capabilities that may be implemented in either antenna-in-package (AiP) constructs or on printed circuit boards (PCBs). For AiP constructs, multiple mm-Wave signals have to be transmitted from an IC structure to a chip scale package structure and then fed to an antenna on a PCB. In other words, the mm-Wave signal has to be transmitted from the IC to the chip scale package and then from the chip scale package to the PCB.

It will be appreciated that the transmission of the mm-Wave signals from the IC to the chip scale package and from the chip scale package to the PCB requires multiple transitions and presents certain challenges to the integrity and performance of the propagating mm-Wave signals. In particular, such multiple transitions expose the mm-Wave signal to signal power degradation, improper impedance matching, undesired coupling issues, and lack of signal isolation, which may compromise the performance of mm-Wave transmissions.

SUMMARY

An object of the present disclosure is to provide a mm-Wave communication structure. The disclosure presented herein employs a first transmission structure, wherein the first transmission structure employs a first ring structure followed by a first ground structure and a second ground structure configured to carry a ground signal, wherein the first ring transition structure employs an outer ring and an inner ring, the first ground structure is discontinuous before second ground structure, a second transmission structure, wherein the second transmission structure employs a second ring transition structure followed by a third ground structure and a fourth ground structure configured to carry the ground signal, wherein the second ring transition structure employs an outer ring and an inner ring, a third transmission structure configured to carry a millimetre wave signal, wherein the third transmission structure begins at the center of the first ring transition structure and the second ring transition structure and the third transmission structure is coplanar with the second transmission structure, and a fourth transmission structure configured to operatively couple an integrated circuit (IC) and the first transmission layer, the second transmission layer, and the third transmission structure.

In accordance with other aspects of the present disclosure the mm-Wave communication structure, wherein the first ring transition structure, the first ground structure and the second ground structure are coplanar, wherein the first ring transition structure further comprises a plurality of vias, wherein the second ground structure is tapered.

In accordance with other aspects of the present disclosure the mm-Wave communication structure, wherein the inner radius of the first ring transition structure is smaller with respect to the inner radius of the second ring transition structure, wherein the second ring transition structure, the third ground structure and the fourth ground structure are coplanar, wherein the second ring transition structure further comprises a plurality of vias.

In accordance with other aspects of the present disclosure the mm-Wave communication structure, wherein the second ring transition structure further comprises an opening for traversal of the third transmission structure through the second transmission structure, wherein the third ground structure is wider than first ground structure, wherein the third ground structure is tapered, wherein the fourth ground structure further comprises a plurality of vias.

In accordance with other aspects of the present disclosure the mm-Wave communication structure, wherein the first ground structure and the third ground structure forms a coplanar waveguide with ground, wherein the second ground structure and the fourth ground structure forms a tapered coplanar waveguide, wherein the second ground structure and the fourth ground structure are connected with a plurality of solder connections to carry ground from the IC to a printed circuit board (PCB).

In accordance with other aspects of the present disclosure the mm-Wave communication structure, wherein the third transmission structure employs a first tapered transmission line, a second transmission line and a third tapered transmission line, wherein, the second transmission line, the first ground structure and the third ground structure forms a quasi-coplanar waveguide with ground, wherein, the third tapered transmission line forms a tapered coplanar waveguide, wherein the first tapered transmission line is connected to fourth transmission structure at the center of at the center of the first ring transition structure and the second ring transition structure, wherein the third tapered transmission line is connected to at least one solder connection to carry millimeter wave signal from the IC to a printed circuit board (PCB).

In accordance with other aspects of the present disclosure the mm-Wave communication structure, wherein the first transmission structure, the second transmission structure, and the third transmission structure are coplanar, wherein the fourth transmission structure is orthogonal and vertical to the first transmission structure, the second transmission structure, and the third transmission structure, wherein the fourth transmission structure comprises a quasi-coax section.

BRIEF DESCRIPTION OF THE FIGURES

The features and advantages of the present disclosure will become apparent from the following detailed description, taken in combination with the appended drawings, in which.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

As used herein, the term "about" or "approximately" refers to a +/−10% variation from the nominal value. It is to be understood that such a variation is always included in a given value provided herein, whether or not it is specifically referred to.

Unless otherwise defined, all technical and scientific terms used herein have the same meaning as commonly understood by one of ordinary skill in the art to which the described embodiments appertain.

Figure 1:
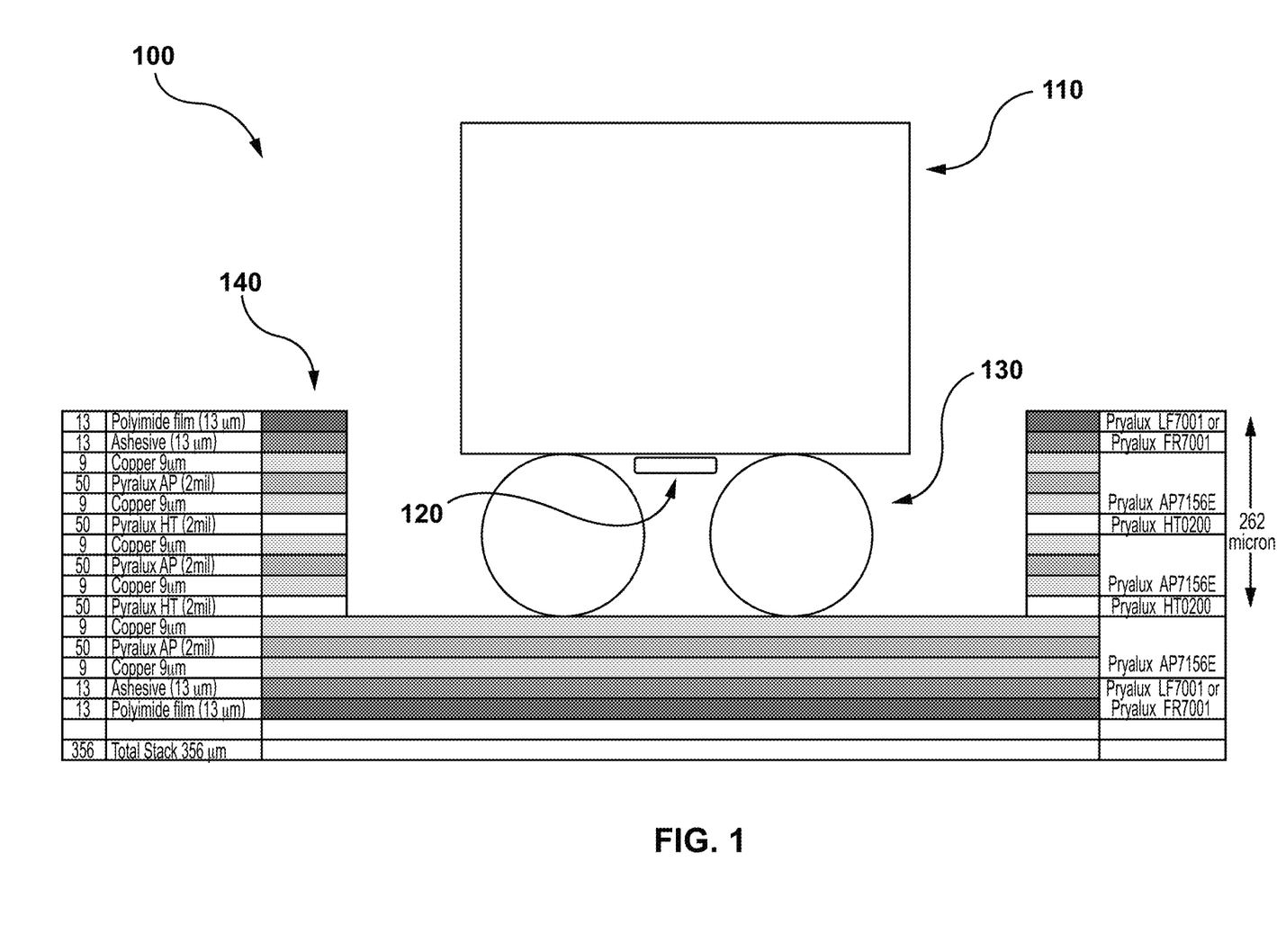
FIG. 1 depicts an exemplary high-level structural diagram of a mm-Wave communication system, in accordance with various embodiments of the present disclosure.

FIG. 1 illustrates an exemplary high-level structural diagram of a mm-Wave communication system 100, in accordance with various embodiments of the present disclosure mm-Wave. The structure of mm-Wave communication system 100 includes an integrated circuit (IC) package 110. As shown, the IC package 110 may incorporate an flipped IC 120 relative to conventional mounting or coupling techniques. Included in the IC package 110 may be one or more connections to facilitate connecting the IC 120 to a printed circuit board (PCB) 140. These connections may be implemented using a solder-base connection, such as, for example, ball grid array (BGA) solder balls 130. Other elements may be present but not illustrated for purposes of tractability and simplicity.

IC package 110 may be implemented in a cavity of PCB 140 and may further be based on an embedded Wafer Level Ball Grid Array (eWLB) packaging technology. The eWLB technology facilitates the implementation of fan-out structures and allows for more space for routing interconnects. In addition, eWLB technology allows for the fabrication of small and flat packages with excellent thermal and electrical performance at a lower costs as well as implementation of ICs having a high number of interconnects.

mm-Wave communication system 100 may further include an antenna array embedded in IC package 110, as an AiP, or may be implemented on the PCB 140. Further, IC 120 may also include multiple high frequency signal transceiver ports for simultaneously transmitting and receiving high frequency signals from antenna arrays.

To address mm-Wave signal transmission from IC 120 to IC package 110 and from IC package 110 to PCB 140, mm-Wave communication system 100 may employ a series of transmission lines, configured to operate in a fan-in area of IC package 110 in a manner such that the mm-Wave signals conveyed by the transmission lines have a minimal interference effects on the functionality of circuits on the IC 120.

As illustrated by FIG. 1, PCB 140 may be implemented as a multi-layered PCB, in which various layers of the PCB are constituted of different materials having different thickness levels. For example, in the illustrated embodiment, Polyimide film comprises a thickness of 13 μm, Adhesive layer comprises a thickness of 13 μm, Copper layer comprises a thickness of 9 μm, Pyralux AP layer comprises a thickness of 2 mil, and the Pyralux HT layer comprises a thickness of 2 mil-. However, it will be appreciated that IC package 110 may be stacked on any suitably configured PCB.

In accordance with the disclosed embodiments, an exemplary structure of mm-Wave communication system 100 may implement a PCB 140 with a total stack height of 356 μm having a cavity height of 262 μm, lower Pyralux AP and coverlay thickness of 94 μm, and midplate thickness greater 400m, to make the total height of structure of mm-Wave communication system 100 approximately 662 μm.

Figure 2:
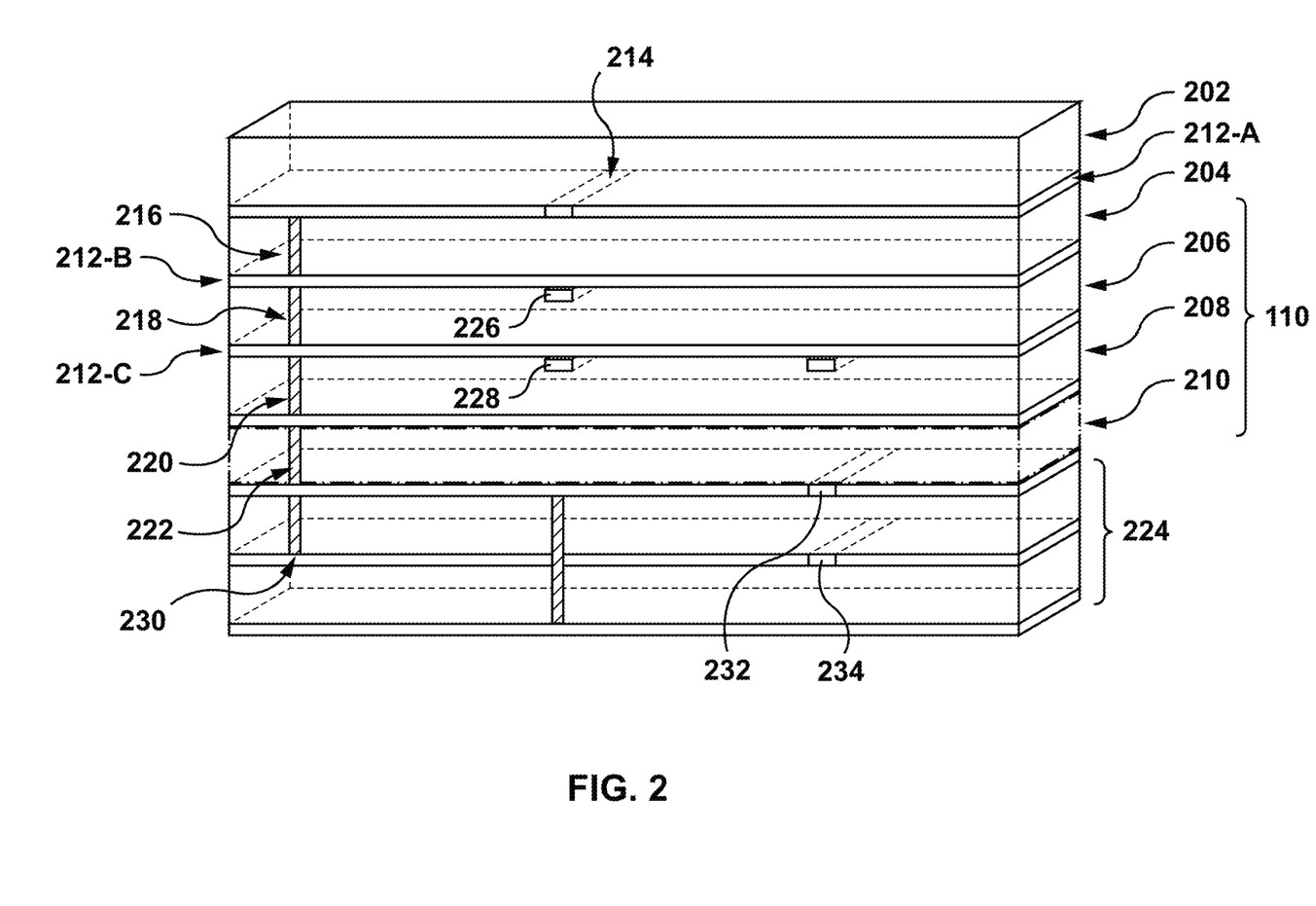
FIG. 2 depicts a high-level three dimensional material stack-up diagram of an IC package, in accordance with various embodiments of the present disclosure.

FIG. 2 depicts a stack-up view of a chip-scale level package incorporating eWLB technology, in accordance with various embodiments of the present disclosure. IC package 110 may employ, a micro-molding layers 204, 206, and 208, metallic layers 212-A, 212-B, and 212-C, a passivation via PSV1 216, a passivation via PSV2 218, and a passivation via PSV3 220. In certain embodiments, a silicon nitride dielectric layer 202 associated with IC 120 may be stacked on the top of the IC package 110.

Further, the metallic layers 212-A, 212-B, and 212-C may further employ a metal 214, a redistribution pad RDL1 226, and a redistribution layer RDL2 228 respectively. As shown, IC package 110 may be stacked upon an air layer 210 employing a transitional ball grid array (BGA) 222. Also, the air layer 210 may be stacked on a PCB 224. PCB 224 may further employ a PCB via 230, a PCB ground layer 232, and a PCB signal layer 234. It will be understood that other layers and vias may be present in IC package 110 and PCB 224 but have not been illustrated for purposes of tractability and simplicity.

In the exemplary structure of IC package 110 depicted by FIG. 2, micro-molding layer 204 and PSV1 216 may be configured to have a height of approximately 12.3 μm, micro-molding layer 206 and PSV2 218 may be configured to have a height of approximately 10.3 μm, micro-molding layer 208 and PSV2 220 may be configured to have a height of approximately 11 μm, air layer 210 and transitional BGA 222 may be configured to have a height of approximately 250 μm, metallic layers 212-A, 212-B, and 212-C employing metal pad 214, redistribution layer RDL1 226, and redistribution layer RDL2 228 respectively, may each be configured to have a height of approximately 5 μm.

Further, IC 120 supplies the mm-Wave signal and ground (GND) signal to metal pad 214 associated with the IC 120. PSV1 216 connects metal pad 214 to RDL1 226 in order for GND signal to be transferred from metal pad 214 to RDL1 226 through PSV1 216. PSV2 218 connects RDL1 226 to RDL2 228 and mm-Wave signal and ground (GND) signal are transferred from metal pad 214 to RDL2 228 through PSV1 216 and PSV2 218. Additionally, PSV3 220 connects RDL2 228 to transitional BGA 222, such that the mm-Wave signal and ground (GND) signal are transferred from RDL2 228 to transitional BGA 222 and eventually onto to PCB 224 through PCB via 230. It will be appreciated that in certain embodiments, the opening of PSV3 220 may be substantially larger than the openings of PSV1 216 and PSV2 218, to accommodate the connection of transitional BGA 222 to RDL2 228.

During the transfer of the mm-Wave signal and ground (GND) signal from IC 120 to PCB 224, RDL1 226, and RDL2 228 are configured to act as transmission lines that convey the signals. Further, RDL1 226, and RDL2 228 operate to minimize interference effects by being configured to achieve optimum impedance matching, minimal mutual energy coupling, and maximum isolation for efficient transmission of mm-Wave signals from IC 120 to PCB 224.

Figure 3:
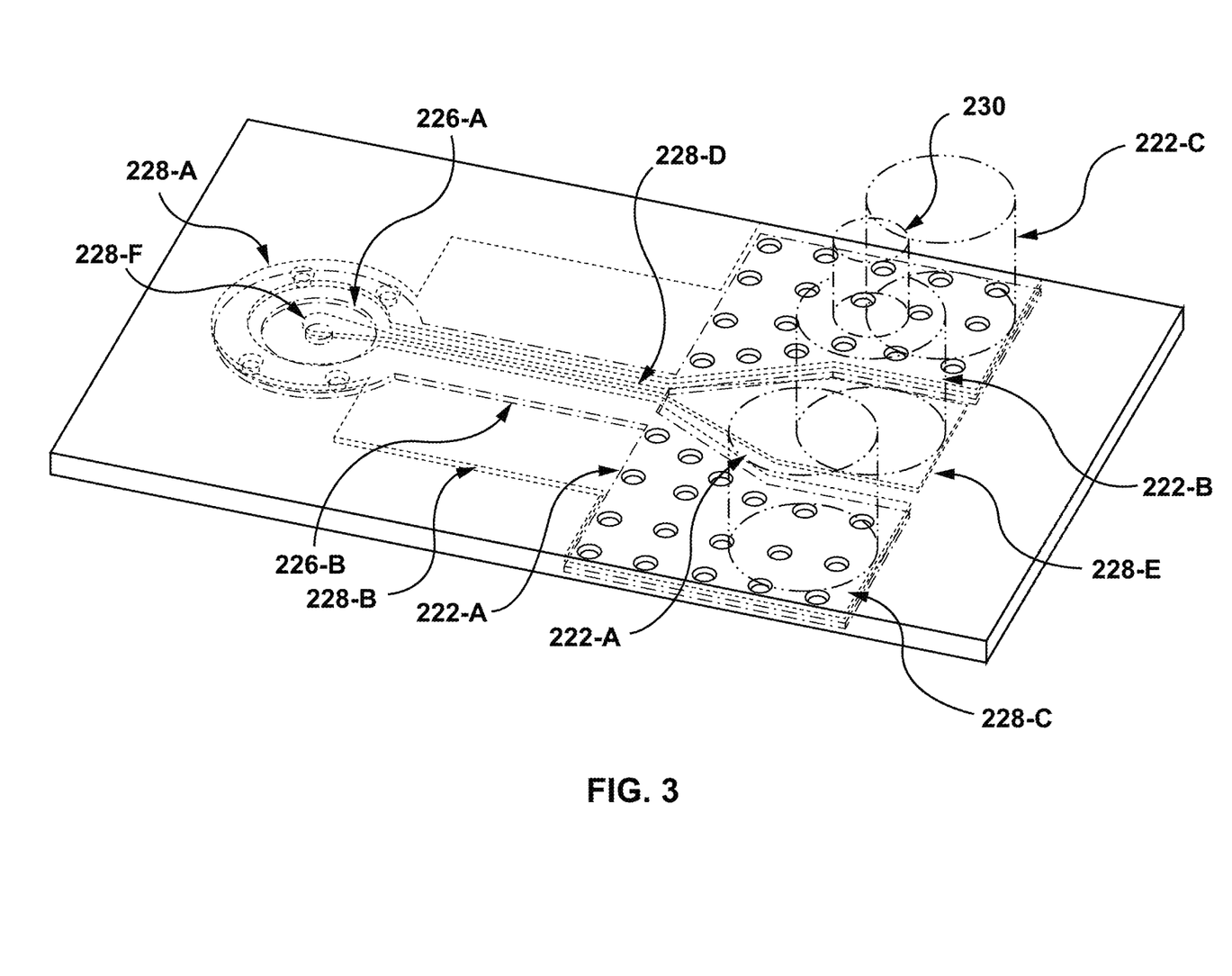
FIG. 3 depicts a high-level structural diagram of a chip scale level package system; including redistribution layers, passivation via layers and moulding compound, in accordance with various embodiments of the present disclosure.

FIG. 3 depicts a representative structure of redistribution layers RDL1 226 and RDL2 228, in accordance with various embodiments of the present disclosure. RDL1 226 and RDL2 228 may be configured to operate in a coplanar manner, as transmission lines have sections of different shapes with smoothly changing impedances to minimize mismatch between IC 120 and IC package 110. In particular, the structure of RDL1 226 may be configured to act as a GND for mm-Wave communication system 100. RDL1 226 is implemented as a ring transition structure 226-A that is followed by a first coplanar GND structure 226-B and a second coplanar GND structure 226-C.

The ring transition structure 226-A further incorporates a plurality of vias, an inner ring and an outer ring for impedance matching in order to restrict the mm-Wave signal from IC 120 to travel in the backwards direction during mm-wave signal transition from vertical (i.e., z) direction to horizontal (i.e., y) direction. Also, ring transition structure 226-A operates as an intersection between IC 120 and rest of the RDL1 226 through PSV1 216.

In certain embodiments, as depicted by FIG. 3, the ring transition structure 226-A of RDL1 226 incorporates four vias may be disposed at substantially equally distances along the circumferential annulus defined by the respective inner and outer rings and a conductive via disposed at the center of the ring transition structure 226-A. The four circumferential vias are configured to operate as shielding ground elements while the center via operates as a mm-Wave signal feed line, such that ring transition structure 226-A operates as a quasi-coaxial waveguide construct. Such a quasi-coaxial waveguide construct maintains the integrity of the transmitted mm-Wave signal by effectively matching any impedance discrepancies due to subsequent stacked layers along the vertical (i.e., z) direction.

First coplanar GND structure 226-B is arranged to be discontinuous at a point prior second coplanar GND structure 226-C. Second coplanar GND structure 226-C is tapered such that it provides an acceptable impedance match at discontinuities between first coplanar GND structure 226-B and second coplanar GND structure 226-C. Further, second coplanar GND structure 226-C is connected to transitional BGA's 222-A and 222-C through PSV3 220.

The structure of RDL2 228 is configured to act as signal line for IC package 110. RDL1 228 is a ring transition structure 228-A followed by a first coplanar GND structure 228-B and a second GND coplanar structure 228-C. The ring transition structure 228-A further incorporates a plurality of vias, an inner ring with an opening, and an outer ring with an opening for impedance matching to restrict the mm-Wave signal from IC 120 to travel in the vertical direction during mm-wave signal transition from vertical (i.e., z) direction to horizontal (i.e., y) direction. The ring transition structure 226-A is tapered with respect to the ring transition structure 228-A such that, the inner radius of ring transition structure 226-A is smaller than the inner radius of ring transition structure 228-A. Also, ring transition structure 228-A provides an intersection between RDL1 226 and rest of the RDL2 228 through PSV2 218.

Similar to the RDL1 226 ring transition structure noted above, the depicted embodiments indicate that the ring transition structure 228-A of RDL2 228 incorporates four vias disposed at substantially equally distances along the circumferential annulus defined by the respective inner and outer rings and a conductive via disposed at the center of the ring transition structure 228-A. The four circumferential vias are configured to operate as shielding ground elements while the center via operates as a mm-Wave signal feed line, such that ring transition structure 228-A operates as a quasi-coaxial waveguide construct. Such a quasi-coaxial waveguide construct maintains the integrity of the transmitted mm-Wave signal by effectively matching any impedance discrepancies due to subsequent stacked layers along the vertical (i.e., z) direction.

Further, first coplanar GND structure 228-B, which is configured to be wider than the first coplanar GND structure 226-B and second coplanar structure 228-C, is tapered in nature to provide an acceptable impedance matching.

As illustrated in FIG. 3, RDL2 228 further employs a tapered quasi-coplanar waveguide with ground (quasi-CPWG) transition structure 228-F that originates at the center of the ring transition structures 226-A, and 228-A. The quasi-CPWG transition structure 228-F is configured to match the impedance of quasi-CPWG line 228-D, which traverses through first coplanar GND structure 228-B. In turn, quasi-CPWG line 228-D is configured to match the impedance of tapered coplanar transition structure 228-E that is subsequently coupled to transitional BGA 222-B through PSV3 220.

It is to be understood that, first coplanar GND structure 226-B and first coplanar GND structure 228-B together operate as a coplanar waveguide structure with GND (CPWG), and that second coplanar GND structure 226-C and second coplanar GND structure 228-C together operates as tapered coplanar waveguide structure with GND (TCPWG). In addition, tapered coplanar transition structure 228-E operates as a tapered coplanar waveguide (TCPW).

As shown, IC 120 supplies the mm-Wave and GND signals to metal pad 214. The GND signal from metal pad 214 is fed to ring transition structure 226-A through PSV1 216 and to ring transition structure 228-A through PSV1 216 and PSV2 218. The mm-Wave signal from metal pad 214 is fed to the tapered quasi-CPWG transition structure 228-F through PSV1 216 and PSV2 218. The combined vertical height of PSV1 216 and PSV2 218 may be approximately 23 μm.

As noted above, by virtue of the ring transition structures 226-A, 228-A incorporating circumferentially shielding ground elements as embodied by PSV1 216, PSV2 218 and a centralized signal feed line as embodied by tapered quasi-CPWG transition structure 228-F, the conveyance of mm-Wave signal from metal pad 214 to RDL2 228 along the vertical (i.e., z) direction is performed in a quasi-coaxial waveguide transmission mode.

The mm-Wave signal transit from vertical (i.e., z) direction and further propagates cross-sectionaly through quasi-CPWG line 228-D along the horizontal (i.e., y) direction, as shown in FIG. 3, in a quasi-microstrip line and CPWG mode as the cross section electrical field distribution is somewhat in between conventional microstrip line mode and CPWG mode. The size of this path may be kept small, such as, for example, 68 μm, for easy routing of multiple mm-Wave signals. The GND signal also propagates along the horizontal (i.e., y) direction through first coplanar GND structure 226-B and first coplanar GND structure 228-B.

Further, at discontinuity between first coplanar GND structure 226-B and second coplanar GND structure 226-C signal transition takes place and mm-Wave signal propagates in horizontal (i.e., y) direction through tapered coplanar transition structure 228-E, then transits in vertical (i.e., z) direction through transitional BGA 222-B and finally to PCB 224 through PCB via 230. Also, GND signal propagates in horizontal (i.e., y) direction through second coplanar GND structure 226-C and second coplanar GND structure 228-C and then transits in vertical (i.e., z) direction through transitional BGA's 222-A and 222-B to provide continuous GND signal from the IC 120 to the PCB 224.

Figure 4:
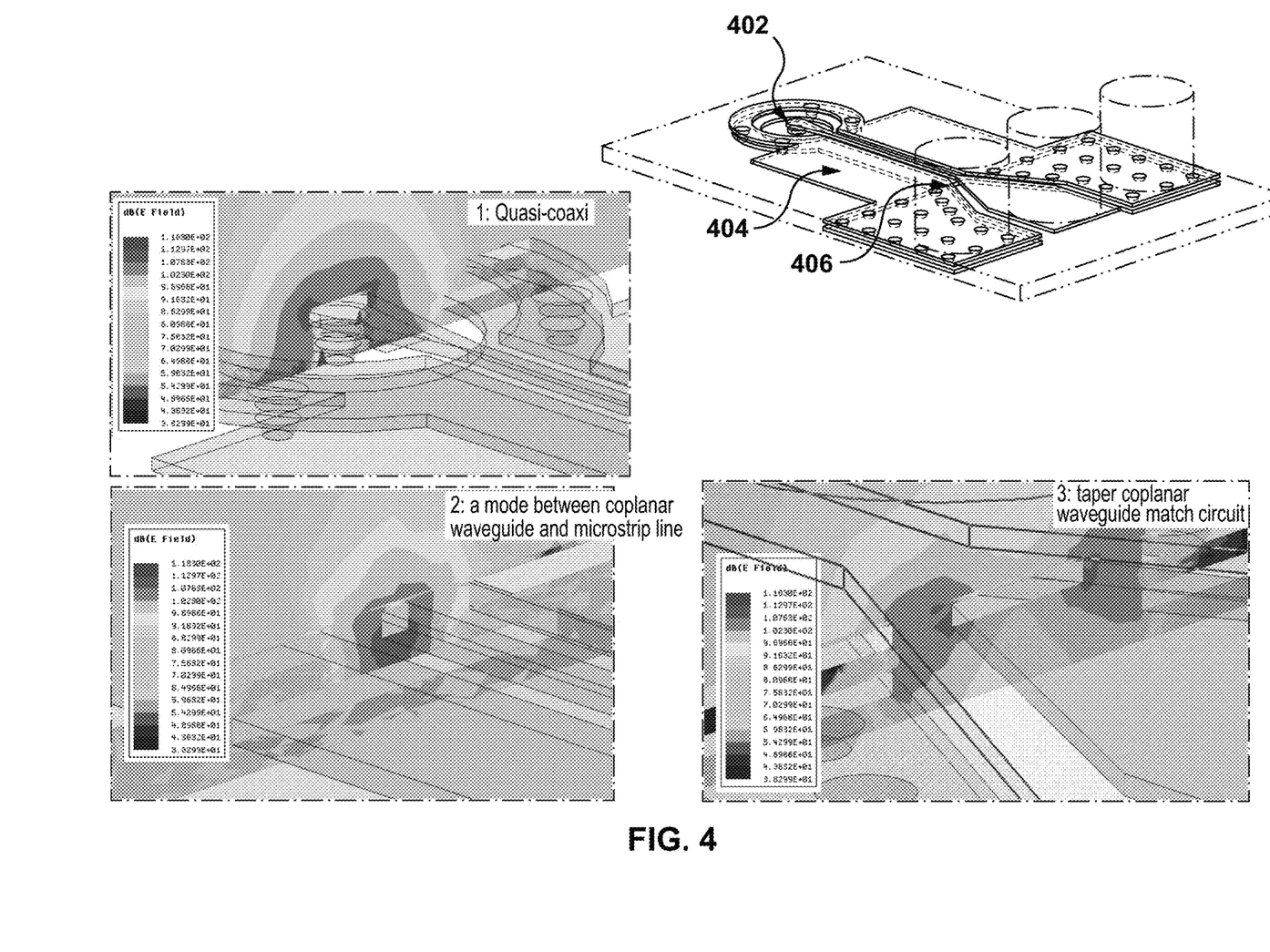
FIG. 4 illustrates an electrical field pattern in dB of mm-Wave signal, in accordance with various embodiments of the present disclosure.

FIG. 4 illustrates an electrical field pattern in dB, in accordance with various embodiments of the present disclosure. Cross-section 402 depicts an fringing electrical field pattern of mm-Wave signal coming from metal pad 214 in quasi-coaxial mode towards RDL1 226 and RDL2 228. The four vias, of ring transition structure 226-A and 228-A, are designed in a manner to assist the mm-Wave signal to propagate towards RDL1 226 and RDL2 228.

Cross-section 404 depicts the fringing electrical field pattern of mm-Wave signal propagating in a quasi microstrip line and CPWG mode. This mm-Wave signal propagation is very close to IC 120 and may affect the functionality of circuits on the IC 120 by back-propagating a part of mm-Wave signal fringing electrical field towards IC 120. As such, RDL1 226 not only acts as a ground but also operates to restrict the backward propagation of mm-Wave signal fringing electrical field to minimize mutual energy coupling between IC 120 and IC package 110.

Cross-section 406 indicates the electrical field pattern of mm-Wave signal propagating in a TCPWG and TCPW mode. In this mode of propagation, RDL1 226 is discontinuous below the junction of quasi-CPWG 228-D and TPCW 228-E. TPCW 228-E provides impedance matching at cross-section 404 and 406, such that, due to discontinuous RDL1 226 below TPCW 228-E leads to fringing electric field towards the edges of TCPWG.

It is to be understood that mm-Wave signal travelling in the waveguide mode between CPWG and microstrip line and is directed towards the fan-out area of IC package 110 for further transmission. For example, the mm-Wave signal may be forwarded to an antenna array embedded in IC package 110, as antenna in package, AiP, or may be redirected from IC package 110 and supplied to PCB 224.

Figure 5:
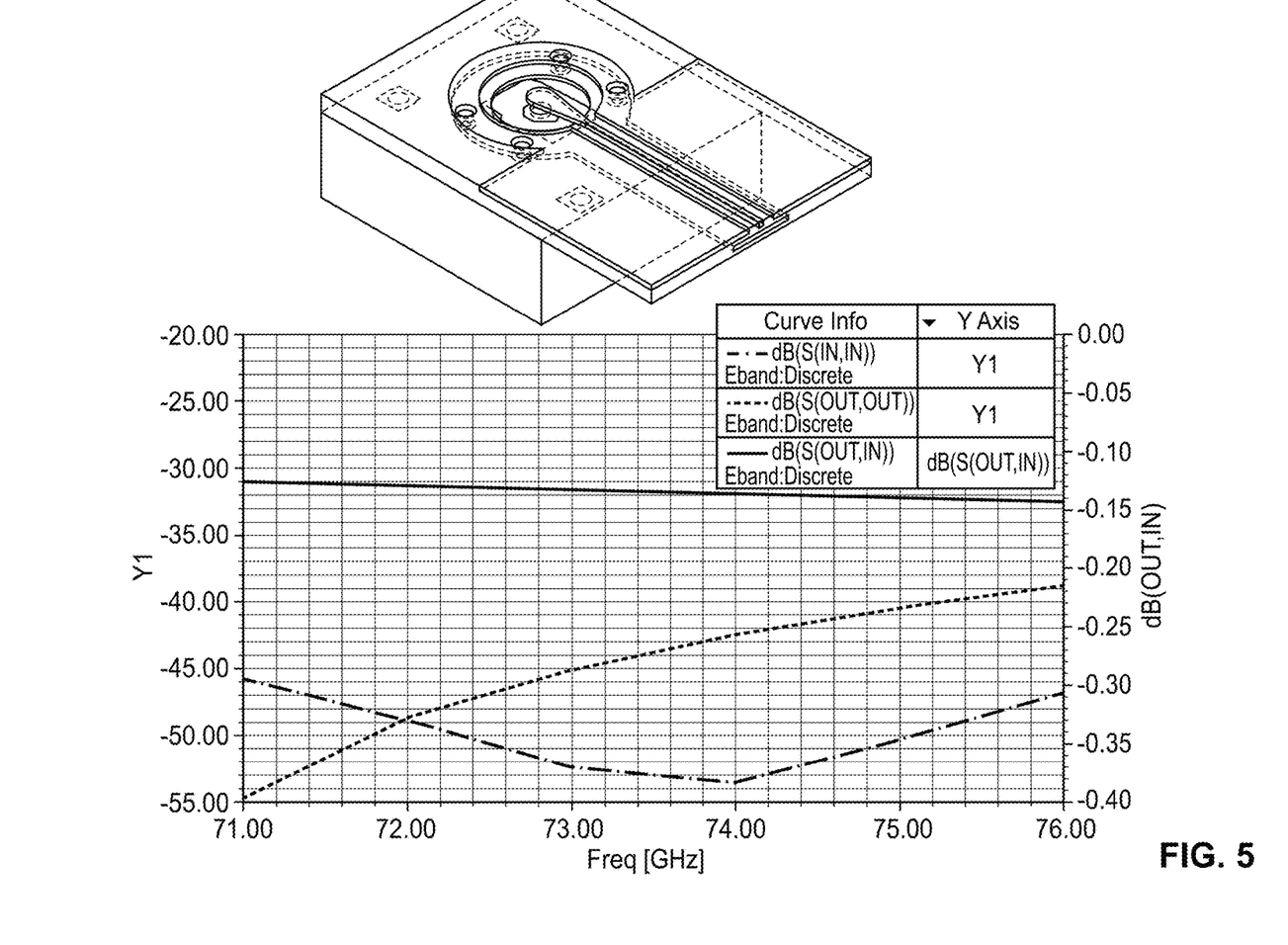
FIG. 5 illustrates small signal scattering (S parameter) response of mm-Wave signal transition from an IC to a redistribution layer in the chip package, in accordance with various embodiments of the present disclosure.

FIG. 5 illustrates mm-Wave small signal scattering parameter (S-Parameter) mm-Wave signal transition from IC 120 to RDL2 228, in accordance with various embodiments of the present disclosure. The solid black curve on the graph represents insertion loss and two dotted black lines on the graph represents input return loss and output return loss for mm-Wave signal while having a transition from IC 120 to RDL2 228. The insertion loss in this case is around −0.15 dB and return loss in this case is around −30 dB.

Figure 6:
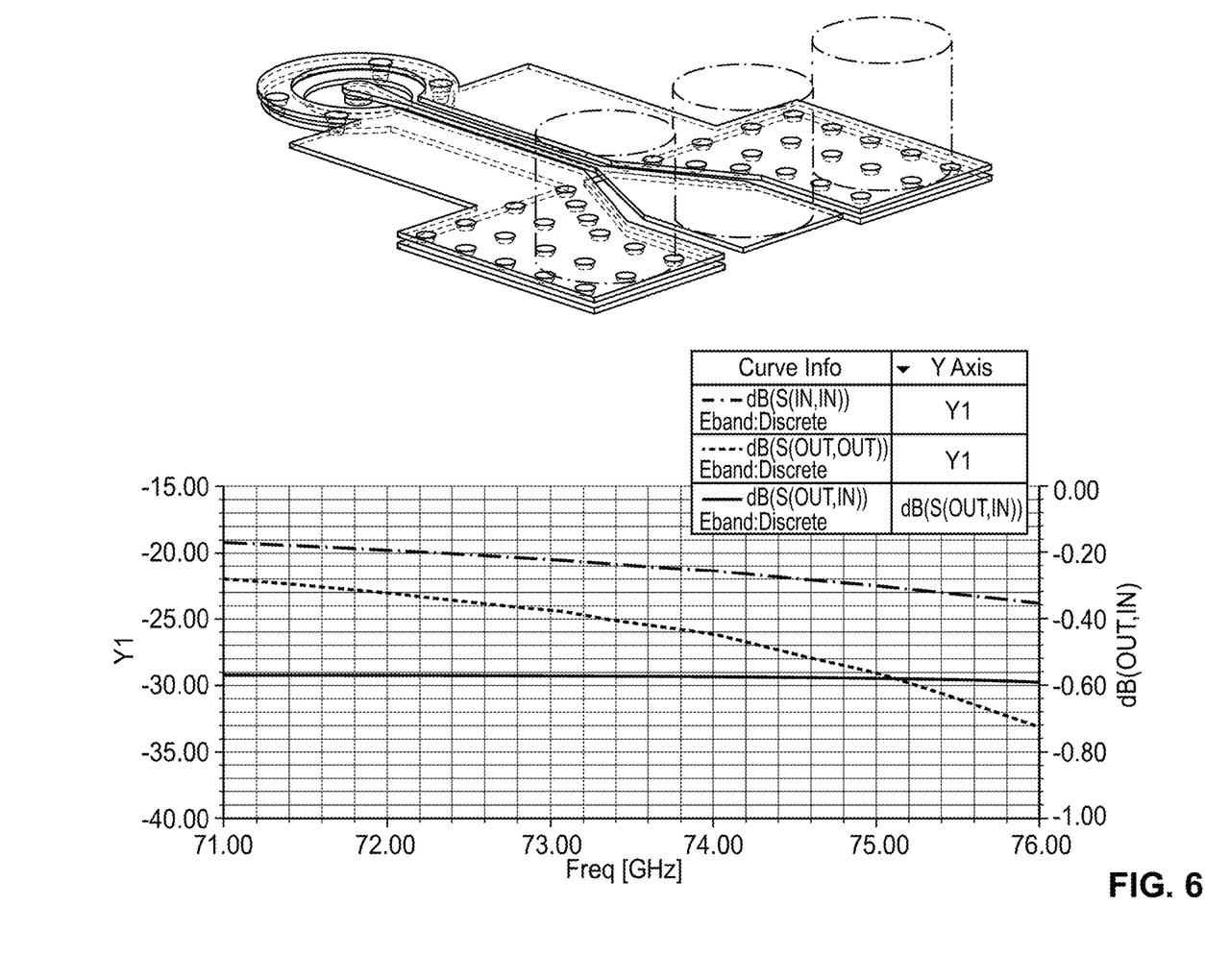
FIG. 6 illustrates small signal scattering (S parameter) of mm-Wave signal transition from chip package to a Ball Grid Array (BGA) and to outer PCB, in accordance with various embodiments of the present disclosure.

FIG. 6 illustrates mm-Wave small signal scattering (S-parameter) of mm-Wave signal transition from IC 120 to PCB strip line (224) through transitional BGA 222, in accordance with various embodiments of the present disclosure. The solid black curve on the graph represents insertion loss and two dotted black lines on the graph represents input return loss and output return loss for mm-Wave signal while having a transition from IC 120 to transitional BGA 222. The insertion loss in this case is around −0.6 dB and return loss in this case is around −20 dB.

Figure 7A:
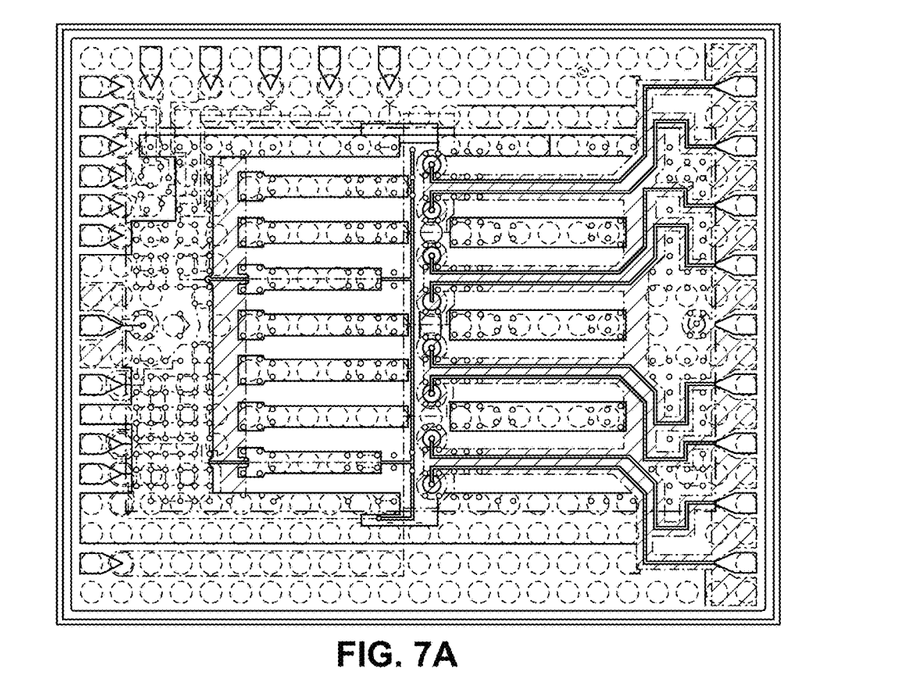
FIG. 7A illustrates layout drawing mm-Wave of a chip scale level package design with one embedded IC, accordance with various embodiments of the present disclosure.

FIG. 7A illustrates layout drawing mm-Wave of a chip scale level package design with one embedded IC for mm-Wave communication system 100, in accordance with various embodiments of the present disclosure. As shown, the layout may define fan-in-area for IC 120 employing eight high frequency signal outputs. The layout then may be properly designed to bring mm-Wave signal from high frequency signal ports out on the edge in fan-out area of IC package 110 in an efficient manner.

Figure 7B:
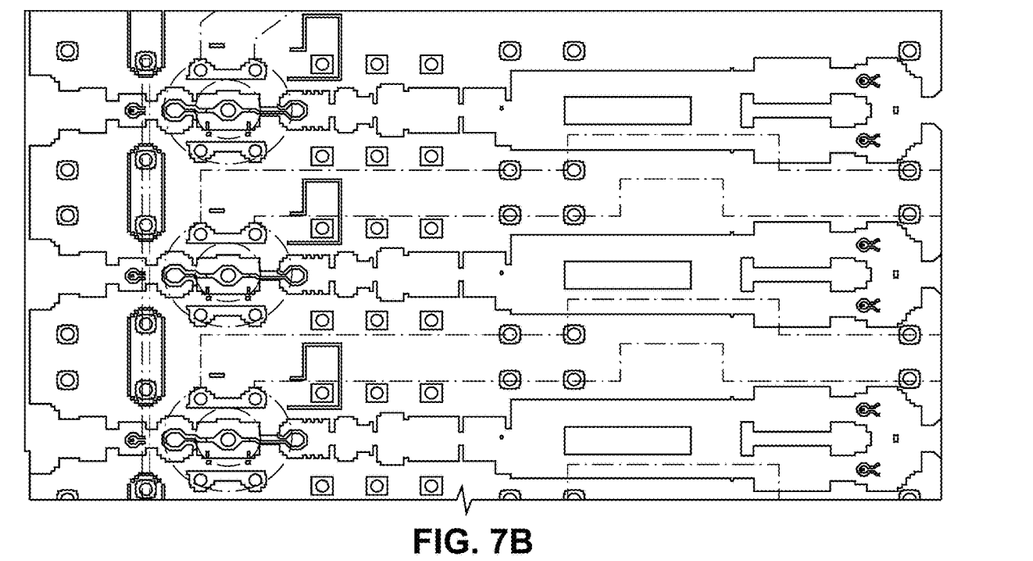
FIG. 7B illustrates mm-Wave zoomed in portion of the redistributed layer layout of the chip-scale level package technology as well as the top metal layer of IC, in accordance with various embodiments of the present disclosure.

FIG. 7B illustrates mm-Wave zoomed in portion of the redistributed layer layout of the chip-scale level package technology as well as the top metal layer of IC, in accordance with various embodiments of the present disclosure. As shown, the routing layout may be designed in such a manner that the mm-Wave signal from IC 120 is transferred via IC Package 110 without affecting the functionality of the circuitry present in IC 120. Further, RDL1 226 may then act as a shielding layer protecting the circuitry present in IC 120 while mm-Wave signal is in transition and transmission over RDL2 228.

Figure 8:
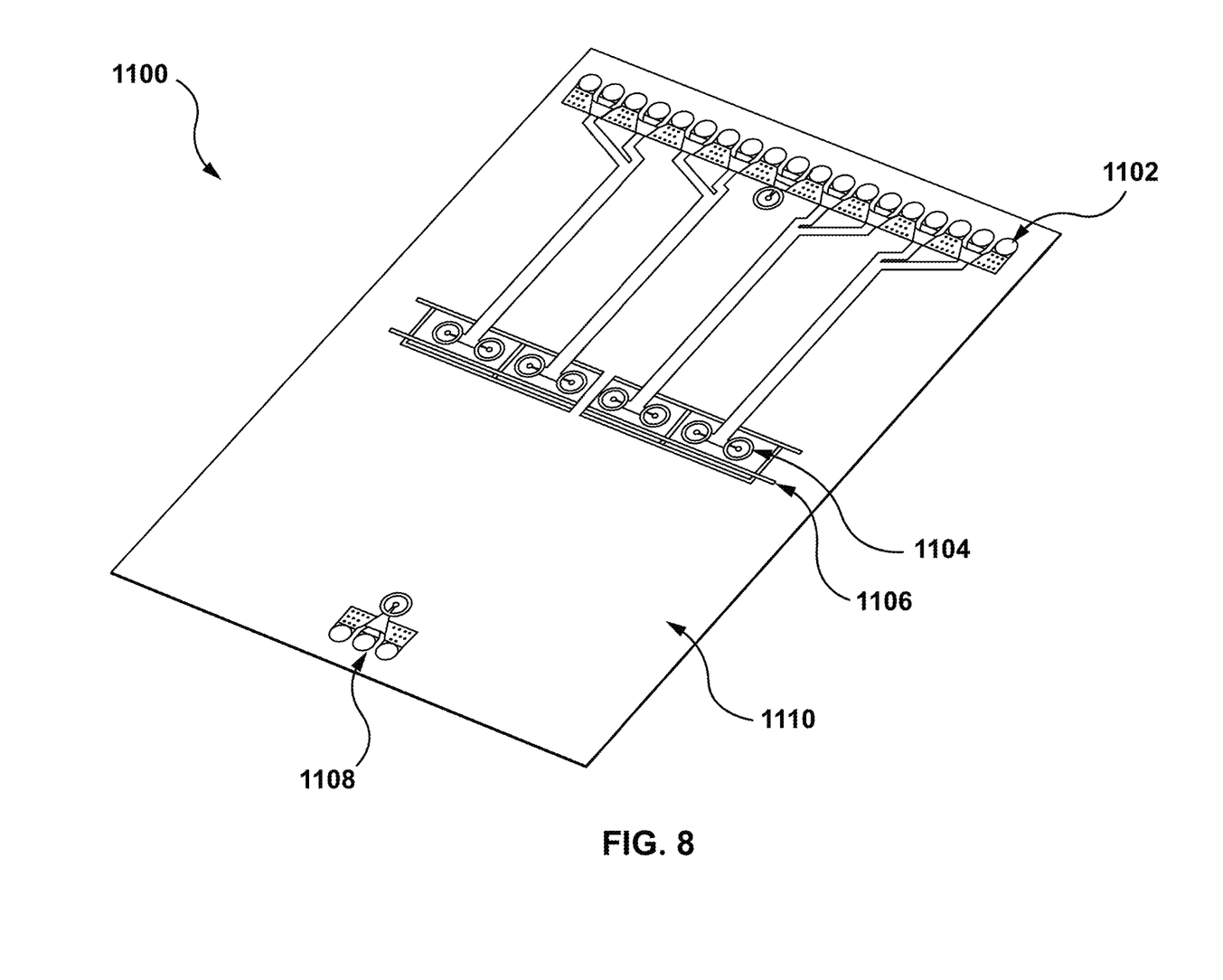
FIG. 8 depicts an exemplary structure of mm-Wave communication system, in accordance with various embodiments of the present disclosure.

FIG. 8 depicts an exemplary structure of mm-Wave communication system 1100, in accordance with various embodiments of the present disclosure. As shown, mm-Wave communication system 1100 designed over IC package 1110, employ nine IC package to PCB transition structures 1102, eight IC to IC package transition structures 1104, layout for DC lines 1106, one RF package to PCB transition structure 1108.

It is to be understood that nine mm-Wave signals from the IC are packaged and wave-guided into PCB transition structures 1102 are designed in consistence with the transition structures employed in IC package 110. Out of nine IC package to PCB transition structures 1102, eight IC package to PCB transition structures may be used to provide transition of eight mm-Wave signals to antenna array (Not Shown) and one IC package to PCB transition structure 1102 may be used to provide transition of combined mm-Wave Transmit signal and combined mm-Wave received signal transition from and to up down converter (UDC).

Further, eight IC to IC package transition structures 1104 are designed in consistence with metal pad 214. Eight IC to IC package transition structures 1104 may be used to provide transition of eight mm-Wave signals from IC to IC package.

Figure 9A:
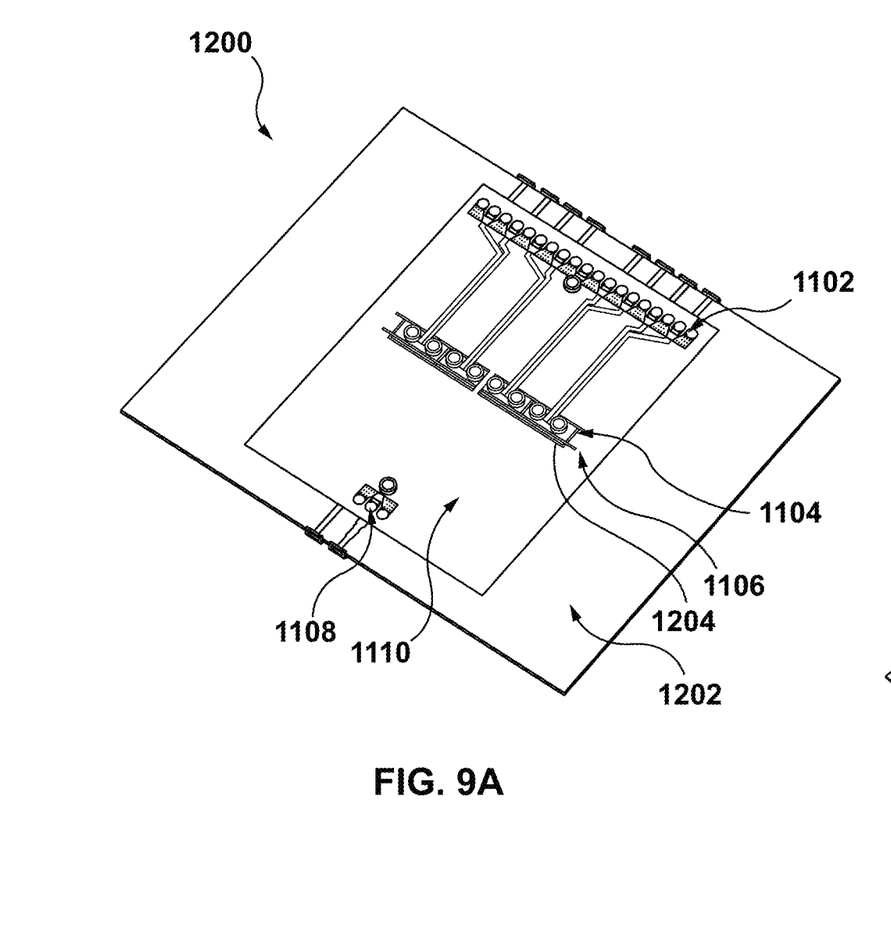
FIGS. 9A, 9B and 9C depict exemplary structures of mm-Wave communication system including antennas on the PCB, in accordance with various embodiments of the present disclosure.
Figure 9B:
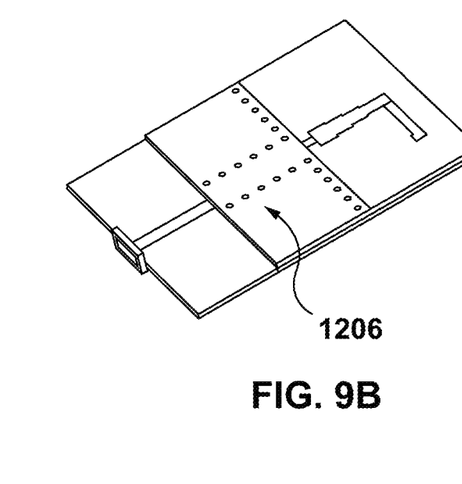
Figure 9C:
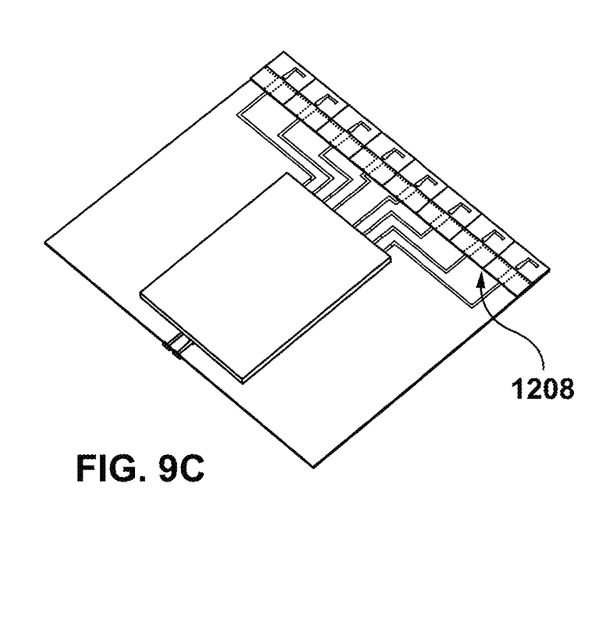

FIGS. 9A, 9B and 9C depict exemplary structures of mm-Wave communication system 1200 including antennas on the PCB, in accordance with various embodiments of the present disclosure. As shown, in FIG. 9A, mm-Wave communication system 1200, designed over IC package 1110, may be implemented over a PCB 1202. mm-Wave communication system 1200 may be provided with coax feed ports 1204 (for simulation purpose only). Other elements may be present but not illustrated for purposes of tractability and simplification.

FIG. 9B illustrates an individual monopole antenna providing end-fire radiation pattern (however it could be any other radiator type) 1206 implemented on PCB 1202. It is to be understood, that individual antenna 1206 may be based on any suitable design. One such example may be an antenna supported for beam steering. Further, FIG. 9C illustrates a configuration of mm-Wave communication system 1200, designed over IC package 1110, may be implemented over a PCB 1202, employ an antenna array 1208 implemented over PCB 1202. Antenna array 1208 may consist of an array of antenna elements 1206.

Consistent with the various embodiments of the present disclosure, mm-Wave communication system 1200 is capable of transitioning mm-Wave signal from IC (not shown) to IC package 1110 using IC to IC package transition structures 1104, transitioning mm-Wave signal from IC package 1110 to PCB 1202 using IC package to PCB transition structures 1102 and finally the mm-Wave signals are forwarded to antenna array 1208. In doing so, mm-Wave communication system 1200 provides an efficient transmission of mm-Wave signals with an improved impedance matching, minimizing mutual energy coupling and maximizing isolation.

Figure 10:
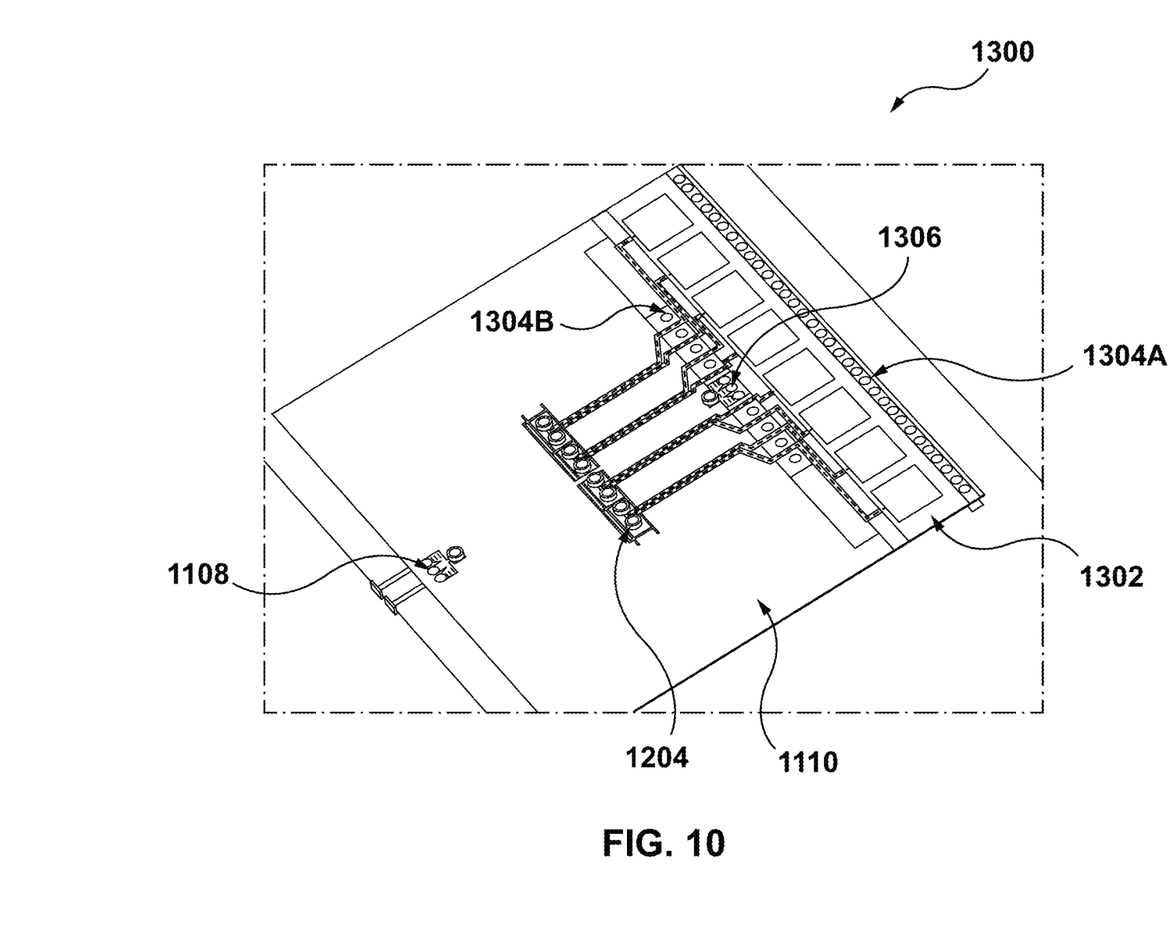
FIG. 10 depict an exemplary structure of mm-Wave communication system including antennas in package (AiP), in accordance with various embodiments of the present disclosure

FIG. 10 depict exemplary structure of mm-Wave communication system 1300 including boresight radiation antennas in package (AiP), in accordance with various embodiments of the present disclosure. mm-Wave communication system 1300, implemented on IC package 1110, may employ antenna in package (AiP) array 1302, solder balls 1304A and 1304B for mechanical support, RXRF transition to UDC structure 1306, coax feed ports 1204 (for simulation purpose only) and TXRF transition to UDC structure 1108. Other elements may be present but not illustrated for purposes of tractability and simplification.

Consistent with the various embodiments of the present disclosure, mm-Wave communication system 1300 is capable of transitioning mm-Wave signal from IC (not shown) to antenna in package (AiP) array 1302. It is to be understood that antenna in package (AiP) array 1302 may be implemented on IC package 1110 in place of PCB 1202. Further, antenna in package (AiP) array may be based on any suitable design. One such example may be an antenna array with steering capabilities.

Figure 11:
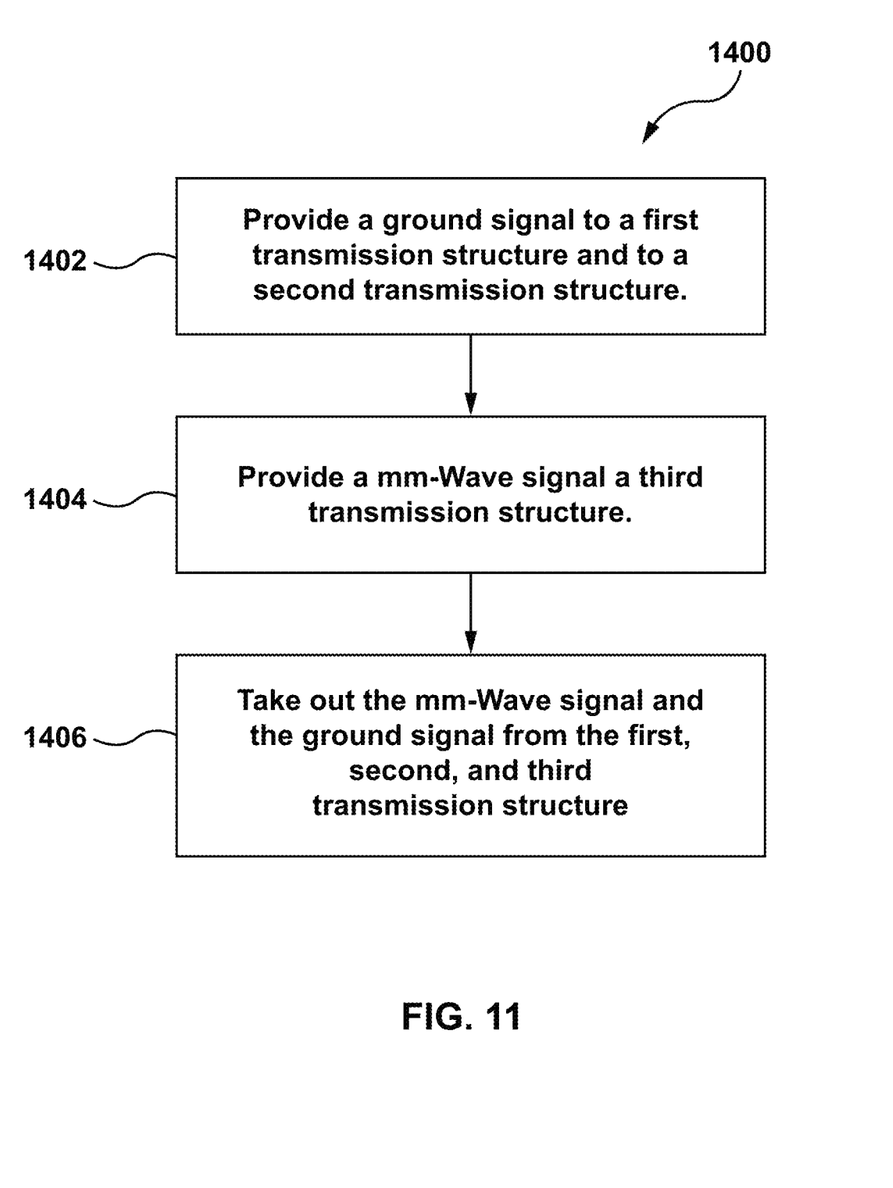
FIG. 11 depicts a functional flow diagram of process directed to transmitting a mm-Wave signal through a mm-Wave communication structure, in accordance with various embodiments of the present disclosure.

FIG. 11 depicts a functional flow diagram of process 1400 directed to transitioning a mm-Wave signal through a mm-Wave communication structure, in accordance with various embodiments of the present disclosure.

Process 1400 commences at task block 1402, where a first transmission structure and a second transmission receives a ground signal. As discussed above, RDL1 226 and RDL2 228 receives a ground signal through PSV1 216 and PSV2 218 in a quasi-coaxial waveguide mode as supplied by IC 120.

Process 1400 proceeds to task block 1406, where a third transmission structure receives a mm-Wave signal. As previously discussed, the tapered quasi-coplanar waveguide with ground (quasi-CPWG) transition structure 228-F associated with RDL2 228 may be configured to receives the mm-Wave signal through PSV1 216 and PSV2 218 in a quasi-coaxial waveguide mode as supplied by IC 120.

Finally, at task block 1406, where the mm-Wave signal and ground signal are taken out from the first, second, and third transmission structure. As noted above, the mm-Wave signal propagating in tapered coplanar transition structure 228-E is taken out through transitional BGA 222-B and the ground signal propagating in second coplanar GND structure 226-C and second coplanar GND structure 228-C is taken out through transitional BGA's 222-A and 222-C. Further, the mm-Wave signal and ground signal are supplied to PCB 224.

As will be understood by those skilled in the art, the various embodiments of the apparatus described above, in operation carry out a method. This method of transmission may comprise the steps of supplying a ground signal to a first transmission structure, wherein the first transmission structure employs a first ring transition structure followed by a first ground structure and a second ground structure, wherein the first ring transition structure employs an outer ring and an inner ring, and wherein the first ground structure is discontinuous before second ground structure; supplying the ground signal to a second transmission structure, wherein the second transmission structure employs a second ring transition structure followed by a third ground structure and a fourth ground structure, wherein the second ring transition structure employs an outer ring and an inner ring; supplying a millimeter wave signal to a third transmission, wherein the third transmission structure begins at the center of the first ring transition structure and the second ring transition structure and the third transmission structure is coplanar with the second transmission structure; and using a fourth transmission structure, coupling an integrated circuit (IC) and the first transmission layer, the second transmission layer, and the third transmission structure.

Those skilled in the art will appreciate that the method outlined immediately above may be carried out in conjunction with any number of different embodiments of the apparatus.

It will also be understood that, although the embodiments presented herein have been described with reference to specific features, structures, and embodiments, it is clear that various modifications and combinations may be made without departing from such disclosures. The specification and drawings are, accordingly, to be regarded simply as an illustration of the inventive concepts and principles as defined by the appended claims, and are contemplated to cover any and all modifications, variations, combinations or equivalents that fall within the scope of the present disclosure.

What is claimed is:

1. A mm-Wave communication structure, comprising:
a first transmission structure, wherein the first transmission structure employs a first ring transition structure followed by a first ground structure and a second ground structure configured to carry a ground signal, wherein:
the first ring transition structure employs an outer ring and an inner ring,
the first ground structure is discontinuous before second ground structure;
a second transmission structure, wherein the second transmission structure employs a second ring transition structure followed by a third ground structure and a fourth ground structure configured to carry the ground signal, wherein the second ring transition structure employs an outer ring and an inner ring;
a third transmission structure configured to carry a millimetre wave signal, wherein the third transmission structure begins at the center of the first ring transition structure and the second ring transition structure and the third transmission structure is coplanar with the second transmission structure; and
a fourth transmission structure configured to operatively couple an integrated circuit (IC) and the first transmission layer, the second transmission layer, and the third transmission structure.

2. The mm-Wave communication structure of claim 1, wherein the first ring transition structure, the first ground structure and the second ground structure are coplanar.

3. The mm-Wave communication structure of claim 1, wherein the first ring transition structure further comprises a plurality of vias.

4. The mm-Wave communication structure of claim 1, wherein the second ground structure further comprises a plurality of vias.

5. The mm-Wave communication structure of claim 1, wherein the second ground structure is tapered.

6. The mm-Wave communication structure of claim 1, wherein the inner radius of the first ring transition structure is smaller with respect to the inner radius of the second ring transition structure.

7. The mm-Wave communication structure of claim 1, wherein the second ring transition structure, the third ground structure and the fourth ground structure are coplanar.

8. The mm-Wave communication structure of claim 1, wherein the second ring transition structure further comprises a plurality of vias.

9. The mm-Wave communication structure of claim 1, wherein the second ring transition structure further comprises an opening for traversal of the third transmission structure through the second transmission structure.

10. The mm-Wave communication structure of claim 1, wherein the third ground structure is wider than first ground structure.

11. The mm-Wave communication structure of claim 1, wherein the third ground structure is tapered.

12. The mm-Wave communication structure of claim 1, wherein the fourth ground structure further comprises a plurality of vias.

13. The mm-Wave communication structure of claim 1, wherein the first ground structure and the third ground structure forms a coplanar waveguide with ground.

14. The mm-Wave communication structure of claim 1, wherein the second ground structure and the fourth ground structure forms a tapered coplanar waveguide with ground.

15. The mm-Wave communication structure of claim 1, wherein the second ground structure and the fourth ground structure are connected with a plurality of solder connections to carry ground from the IC to a printed circuit board (PCB).

16. The mm-Wave communication structure of claim 1, wherein the third transmission structure employs a first tapered transmission line, a second transmission line and a third tapered transmission line.

17. The mm-Wave communication structure of claim 16 wherein, the second transmission line, the first ground structure and the third ground structure forms a quasi-coplanar waveguide with ground.

18. The mm-Wave communication structure of claim 16 wherein, the third tapered transmission line forms a tapered coplanar waveguide.

19. The mm-Wave communication structure of claim 16, wherein the first tapered transmission line is connected to fourth transmission structure at the center of the first ring transition structure and the second ring transition structure.

20. The mm-Wave communication structure of claim 19, wherein the third tapered transmission line is connected to at least one solder connection to carry millimeter wave signal from the IC to a printed circuit board (PCB).

21. The mm-Wave communication structure of claim 1, wherein the first transmission structure, the second transmission structure, and the third transmission structure are coplanar.

22. The mm-Wave communication structure of claim 21, wherein the fourth transmission structure is orthogonal and vertical to the first transmission structure, the second transmission structure, and the third transmission structure.

23. The mm-Wave communication structure of claim 1, wherein the fourth transmission structure comprises a quasi-coax section.

* * * * *

UNITED STATES PATENT AND TRADEMARK OFFICE
CERTIFICATE OF CORRECTION

PATENT NO.         : 10,937,748 B1                                      Page 1 of 1
APPLICATION NO.    : 16/568715
DATED              : March 2, 2021
INVENTOR(S)        : Houssam Kanj et al.

It is certified that error appears in the above-identified patent and that said Letters Patent is hereby corrected as shown below:

In the Drawings

Sheet 3, Figure 3, and on the title page, in the print figure, the second coplanar GND structure labeled as "222-A" (the left one) should read -- 226-C --

In the Specification

Column 6, Line 27, "RDL1 228" should read -- RDL2 --

Column 6, Line 59, "second coplanar structure 228-C" should read -- second coplanar GND structure 228-C --

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*